US011894061B2

(12) United States Patent
Dalgaty

(10) Patent No.: US 11,894,061 B2
(45) Date of Patent: Feb. 6, 2024

(54) NON-VOLATILE MEMORY PROGRAMMING CIRCUIT AND A METHOD OF PROGRAMMING NON-VOLATILE MEMORY DEVICES

(71) Applicant: COMMISSARIAT A L'ENERGIE ATOMIQUE ET AUX ENERGIES ALTERNATIVES, Paris (FR)

(72) Inventor: Thomas Dalgaty, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 114 days.

(21) Appl. No.: 17/733,877

(22) Filed: Apr. 29, 2022

(65) Prior Publication Data

US 2022/0375527 A1 Nov. 24, 2022

(30) Foreign Application Priority Data

May 19, 2021 (EP) ..................................... 21305657

(51) Int. Cl.
| | |
|---|---|
| *G11C 16/10* | (2006.01) |
| *G11C 7/10* | (2006.01) |
| *G11C 16/04* | (2006.01) |
| *G11C 16/26* | (2006.01) |

(52) U.S. Cl.
CPC .......... *G11C 16/102* (2013.01); *G11C 7/1012* (2013.01); *G11C 16/0433* (2013.01); *G11C 16/26* (2013.01)

(58) Field of Classification Search
CPC . G11C 16/102; G11C 7/1012; G11C 16/0433; G11C 16/26; G11C 11/54; G11C 7/1006; G06N 7/01; G06N 3/047
USPC ......................................... 365/185.07, 185.24
See application file for complete search history.

(56) References Cited

U.S. PATENT DOCUMENTS

| | | | | |
|---|---|---|---|---|
| 5,473,731 A | * | 12/1995 | Seligson | G06V 10/754 706/29 |
| 5,584,000 A | * | 12/1996 | Benschop | G06F 9/261 712/E9.01 |
| 8,391,068 B2 | * | 3/2013 | Shelton | G11C 16/16 365/185.24 |

(Continued)

FOREIGN PATENT DOCUMENTS

WO WO-2004111942 A2 * 12/2004 ............. H03M 7/30

OTHER PUBLICATIONS

Dalgaty, et al., "In-situ learning harnessing intrinsic resistive memory variability through Markov Chain Monte Carlo Sampling", arXiv. org, Cornell University Library, 2020.
Raoux, et al., "Phase change materials and their application to non-volatile memories", Chem. Rev., vol. 110, pp. 240-267, 2010.
Kent, et al., "A new spin on magnetic memories", Nat. Nanotech., vol. 41, No. 10, pp. 187-191 , 2015.

(Continued)

*Primary Examiner* — Michael T Tran
(74) *Attorney, Agent, or Firm* — BakerHostetler

(57) ABSTRACT

A memory programming circuit for programming a non-volatile memory device having an array structure includes a plurality of rows, each row having a row index and comprising one or more memory units, each memory unit being configured to receive one or more input signals and to deliver one or more output signals, the memory programming circuit comprising: a first source line connected to the top electrode of the memory units comprised at rows of odd row indices, and a second source line connected to the top electrodes of the memory units comprised at rows of even row indices.

8 Claims, 4 Drawing Sheets

(56) References Cited

U.S. PATENT DOCUMENTS

| | | | | |
|---|---|---|---|---|
| 10,446,223 | B1* | 10/2019 | Nebesnyi | G11C 11/412 |
| 11,334,544 | B2* | 5/2022 | Wang | G06F 16/2379 |
| 11,435,941 | B1* | 9/2022 | Xu | G06N 5/04 |
| 2009/0315742 | A1* | 12/2009 | Breiling | H03M 13/2789 |
| | | | | 341/81 |
| 2014/0016390 | A1 | 1/2014 | Zhao et al. | |
| 2014/0293102 | A1* | 10/2014 | Vogelsang | H04N 25/772 |
| | | | | 348/294 |
| 2014/0317667 | A1* | 10/2014 | Jeong | H04N 21/2383 |
| | | | | 725/115 |
| 2016/0164636 | A1* | 6/2016 | Wang | H04N 21/438 |
| | | | | 725/131 |
| 2020/0073594 | A1* | 3/2020 | Trout | G06F 3/0604 |
| 2020/0302187 | A1* | 9/2020 | Wang | H04L 25/0204 |
| 2021/0185396 | A1* | 6/2021 | Deragon | G06F 17/16 |
| 2023/0209091 | A1* | 6/2023 | Boyce | H04N 19/597 |
| | | | | 348/43 |

OTHER PUBLICATIONS

Mikolajick, et al., "FeRAM technology for high density applications", Microelectron. Reliab., vol. 41, pp. 947-950, 2001.

Ielmini, "Resistive switching memories based on metal oxides: mechanisms, reliability and scaling", Semiconductor Science and Technology, vol. 31, No. 6, pp. 063002, 2016.

Takahashi, et al., "Self-Aligned-Gate Metal/Ferroelectric/Insulator/Semiconductor Field-Effect Transistors with Long Memory Retention", Japanese Journal of Applied Physics, vol. 44, No. 25, pp. 800-802, 2005.

Compagnoni, "Reviewing the Evolution of the NAND FLASH Technology", Proceedings of the IEEE, vol. 105, No. 9, pp. 1609-1633, 2017.

Dalgaty, et al., "In situ learning using intrinsic memristor variability via Markov chain Monte Carlo sampling", Nature Electronics, vol. 4, pp. 151-161, 2021.

* cited by examiner

NON-VOLATILE MEMORY PROGRAMMING CIRCUIT AND A METHOD OF PROGRAMMING NON-VOLATILE MEMORY DEVICES

CROSS-REFERENCE TO RELATED APPLICATION

This application claims priority to foreign European patent application No. EP 21305657.5, filed on May 19, 2021, the disclosure of which is incorporated by reference in its entirety.

FIELD OF THE INVENTION

The invention generally relates to non-volatile memories and in particular to a memory programming circuit for programming non-volatile memory devices and a method for programming non-volatile memory devices.

BACKGROUND

Memory devices are categorized into volatile and non-volatile memories. Non-volatile memories are a type of computer memory that can retain stored information even after power is removed. Examples of non-volatile memories comprise FLASH memories, read-only memories, ferroelectric random access memories, and magnetic memories.

Non-volatile memories are typically used as secondary storage means and for long-term persistent storage.

Recent years have witnessed the development of small and tiny computing devices used in data storage and data transmission. With the emergence of IoT (Internet of Things), connected devices and 5G (and beyond) applications, the demand for enhanced security for data storage and transmission and hardware authentication is increasing.

In this context, non-volatile memory technologies are gaining increasing interest for hardware security and computing applications thanks to their intrinsic behavior that can be harnessed for developing high-performance, low-cost and low-energy security and computing devices capable of meeting the performance, security, and low-energy consumption requirements for IoT and 5G devices and services. Enabling data and hardware security, memory devices can constitute the core for ultra-small and low-power security and computing primitives.

Non-volatile memories are based, for instance, on resistive, phase change, magnetic or ferroelectric materials, or on the trapping of electrical charges in conductors surrounded by dielectrics.

Exemplary emerging non-volatile memories comprise:

phase change memories (PCM), disclosed for example in "S. Raoux, W. Welnic and D. Ielmini, "Phase change materials and their application to non-volatile memories," Chem. Rev., vol. 110, p. 240-267, 2010";

magneto-resistive random access memories (MRAM), disclosed for example in "A. D. Kent and D. C. Worledge, "A new spin on magnetic memories," Nat. Nanotech., vol. 41, no. 10, p. 187-191, 2015";

ferroelectric random access memories (FeRAM), disclosed for example in "T. Mikolajick, C. Dehm, W. Hartner, I. Kasko, M. Kastner, N. Nagel, M. Moert and C. Mazure, "FeRAM technology for high density applications," Microelectron. Reliab., vol. 41, p. 947-950, 2001";

resistive switching random access memories (RRAM), disclosed for example in "D. Ielmini, "Resistive switching memories based on metal oxides: mechanisms, reliability and scaling," Semiconductor Science and Technology, vol. 31, no. 6, p. 063002, 2016";

Ferromagnetic Filed-Effect Transistors (FeFET), disclosed for example in "M. Takahashi and S. Sakai, "Self-Aligned-Gate Metal/Ferroelectric/Insulator/Semiconductor Field-Effect Transistors with Long Memory Retention," Japanese Journal of Applied Physics, vol. 44, no. 25, p. 800-802, 2005, and FLASH memories, disclosed for example in "C. M. Compagnoni, A. Goda, A. S. Spinelli, P. Feeley, A. L. Lacaita and A. Visconti," Reviewing the Evolution of the NAND FLASH Technology, "Proceedings of the IEEE, 2017".

Such non-volatile memories have a 2-terminal structure where the application of suitable voltage pulses can change one or more properties of a memory element, for instance an active material in PCM, MRAM, FeRAM, RRAM and FeFET or a floating-gate MOSFET in FLASH memories.

More specifically, in a PCM device, a phase-change material exists in two solid states having different structures, namely crystalline and amorphous states, with different optical and transport properties.

An MRAM device consists of a metal-insulator-metal structure comprising two electrodes of ferromagnetic material separated by a thin tunneling layer of dielectric material. The two electrodes comprise a pinned layer having a fixed magnetic polarization and a free layer having a magnetic polarization that can be switched in either direction. The magnetic polarization properties and the magnetoresistive effect result in the existence of two polarization states and two memory states corresponding to two different resistive states.

A FERAM device relies on a metal-insulator-metal structure including a ferroelectric layer sandwiched between two electrodes. The polarization of the ferroelectric layer can be oriented by the application of a voltage to the metal-insulator-metal structure.

An RRAM device consists of a metal-insulator-metal structure, where a dielectric layer is sandwiched between two metallic electrodes, the top electrode (RE) and the bottom electrode (BE). FIG. 1 illustrates the 2-terminal structure of an RRAM cell (also referred to as a 'memory element' or a 'memory unit'). Such structure is made of three layers, two metal layers 10 and an insulator layer 11. The metal-insulator-metal structure comprises in addiction a top electrode 12 and a bottom electrode 13. Exemplary RRAM devices comprise Oxide memory devices (Ox-RAM), conductive bridge memory devices (CBRAM), polymeric-based memories, and molecular memories. Resistive RAMs in particular are a promising technology for the development of in-memory computing systems due to their efficient implementation of the dot-product operation and compatibility with existing CMOS processes.

A FLASH memory, electrons can be injected by tunneling into a floating gate, surrounded by dielectric oxide, modifying the threshold voltage of a MOSFET.

Although the physical mechanisms in PCM, MRAM, FERAM, FeFET, FLASH, and RRAM are different, they all display random physical phenomena resulting in intrinsic variations of the resistance (hereafter referred to as both resistance and its inverse, conductance) level and/or switching parameters. While such variations can be critical issues for memory applications, stochastic phenomena in non-volatilememory devices can serve as a physical source of entropy that is needed for hardware security and stochastic computing primitives. Indeed, the stochastic physical mechanisms of transport and/or switching in non-volatile memory devices result in variations in the switching time, the switching voltage and in the parameters of the device final state after switching—namely randomness in the resistance value. Such variations can be harnessed and used as physical sources of entropy for example for random number generation and for in-memory computing applications—notably implementations of Markov chain Monte Carlo sampling algorithms.

Such algorithms use the cycle-to-cycle programming resistance variability of memory devices to perform in-memory machine learning. These approaches use a basic circuit architecture where memory devices are structured in a crossbar array. Therein, horizontal metal lines (similarly referred to as 'rows' and/or 'bit lines') and vertical metal columns (often referred to as 'source lines') are arranged such that at that the intersection of a row and a column there exists a memory device that can be read and programmed independently of the others. Often a transistor, or a selection device, is incorporated in series with each memory device as a means of reducing leakage currents. A memory device is accordingly a P×M array comprising P rows and M columns and a memory unit is located at the intersection of a row of a row index 'p' and a column of a column index 'm', with the row index p varying from 1 to P and the column index m varying from 1 to M.

FIG. 2 illustrates an array architecture of an RRAM memory device having a P×M array architecture. The memory unit 200 illustrated in FIG. 2 is an exemplary memory unit located at row 1, at the intersection of row 1 and column M.

This basic array architecture of non-volatile memory devices is used in existing in-memory computing algorithms. For example, RRAM memory-based Markov Chain Monte Carlo (MCMC) sampling is a recently proposed in-situ machine learning approach that uses the cycle-to-cycle variability of RRAM to implement MCMC sampling as disclosed in "Dalgaty, T., Castellani, N., Turck, C., Harabi, K. E., Querlioz, D., & Vianello, E. (2021), In situ learning using intrinsic memristor variability via Markov chain Monte Carlo sampling, Nature Electronics, pages 1-11". The building block of the RRAM-based MCMC learning system, referred to as a 'Bayesian neuron', uses the standard RRAM array architecture depicted in FIG. 2. More specifically, MCMC sampling is based on the update operations performed in RRAM devices in consecutive rows. The read current from a memory unit located at the intersection of a row of index n and a column of a column index m is used to perform a SET programming operation of the memory unit comprised at the intersection of the row of a row index n+1 and the column of the column index m. More specifically, MCMC sampling is based on reading each memory unit located at the intersection of a row of a row index n and a column of column index m and programming the memory unit located at the intersection of the row of a row index n+1 and the column of a column index m with a SET programming current that is a function of the conductance of the memory unit located at the intersection of the row of row index n and the column of a column index m. Accordingly, the memory unit under programming samples a new conductance value from its cycle-to-cycle conductance probability distribution that is a normal distribution. If the memory devices in row n store the input parameters (synapses) of a Bayesian neuron, then by doing this for each device in row n+1 a new set of input parameters will have been proposed that exhibit Gaussian random permutations of the parameters in row n. In other words, one step of a Markov chain random walk has been executed.

By using the standard RRAM array architecture for implementing the Bayesian neuron, a sequence of operations would be required to achieve the critical operation of the sampling algorithm. Indeed, as disclosed in the cited article above, first, the memory unit located at a row of a row index n must be read by applying a read voltage to the source line that is the line connecting to the TOP electrodes of the memory unit, and turning the series selector transistor to its ON state. Then, the resulting read current must be digitized using an analog-to-digital converter (ADC) and recorded in a separate memory, for example an SRAM or DRAM. Then, the voltage on the source line must be updated to a SET programming voltage. The read current would then have to be used to generate an appropriate voltage at the selector transistor gate in order to program the memory unit located at the row of a row index n+1. The use of such conversions between the digital and analog domains and the need to read and write to external memory and the state machine or microprocessor code required to coordinate such operations would likely make the implementation of such in-situ computing algorithms inefficient in practice.

There is accordingly a need for developing practical, low-complexity, and efficient architectures for RRAM devices in particular and for non-volatile memory devices in general.

SUMMARY OF THE INVENTION

In order to address these and other problems, there is provided a memory programming circuit for programming a non-volatile memory device, the non-volatile memory device having an array structure comprising a plurality of rows of a given number. Each row has a row index varying from one to the given number and comprises one or more memory units. Each memory unit is configured to receive one or more input signals and to deliver one or more output signals. The memory programming circuit comprises:

a first source line connected to the top electrode of the memory units comprised at rows of odd row indices, and;

a second source line connected to the top electrodes of the memory units comprised at rows of even row indices.

According to some embodiments, the memory programming circuit may comprise an analog circuit configured to receive the output signals from the one or more memory units and to deliver to at least one memory unit a programming signal as an input signal, the analog circuit being configured to perform a programming operation for each pair of successive rows in the plurality of rows, a pair of successive rows comprising a first row and a second row, the first row being connected to a first line selected among the first source line and the second source line depending on whether the row index of the first row is odd or even, the second row being connected to a second line selected among the first source line and the second source line depending on whether the row index of the second row is odd or even, the analog circuit being configured to perform the programming operation by: reading the output signals delivered by the memory units comprised in the first row; applying a read voltage to the first line;

determining a programming signal by applying a signal transformation function to the output signals;
applying a programming voltage to the second line;
feeding the memory units comprised in the second row by the programming signal as the input signal of each of the memory units.

According to some embodiments, the analog circuit may be a single circuit multiplexed between the plurality of rows, the analog circuit comprising a multiplexer, a signal transforming unit, and a de-multiplexer, the multiplexer being configured to receive the output signals delivered by the one or more memory units comprised in the plurality of rows, the signal transforming unit being configured to perform the programming operation, and the de-multiplexer being configured to feed each programming signal to the memory units comprised in the appropriate row.

According to some embodiments, the signal transformation function may be a current multiplication function, the output signal being a current signal, the analog circuit being a current buffer amplifier configured to apply a virtual ground, read the current signal and determine the programming signal as a voltage signal.

According to some embodiments, the analog circuit may comprise a resistor-divider configured to determine the voltage signal from the read current.

According to some embodiments, the signal transformation operation may be a square root function.

According to some embodiments, the signal transformation operation may be a voltage multiplication function.

According to some embodiments, the non-volatile memory device may be chosen in a group of non-volatile memory devices comprising phase change memory devices, ferroelectric random access memory devices, and resistive memory devices, Ferromagnetic field effect transistors, FLASH transistors said resistive memory devices comprising magneto-resistive random access memory devices and resistive switching random access memory devices.

There is also provided a method for programming a non-volatile memory device, the non-volatile memory device having an array structure comprising a plurality of rows of a given number, each row having a row index varying from one to the given number and comprising one or more memory units, each memory unit receiving one or more input signals and delivering one or more output signals, the method comprising:
connecting a first source line to the top electrode of the memory units comprised at rows of odd row indices, and
connecting a second source line to the top electrodes of the memory units comprised at rows of even row indices.

According to some embodiments, the method may further comprise performing a programming operation by an analog circuit for each pair of successive rows in the plurality of rows, a pair of successive rows comprising a first row and a second row, the first row being connected to a first line selected among the first source line and the second source line depending on whether the row index of the first row is odd or even, the second row being connected to a second line selected among the first source line and the second source line depending on whether the row index of the second row is odd or even, the programming operation comprising: reading the output signals delivered by the memory units comprised in the first row; applying a read voltage to the first line;
determining a programming signal from the output signals by applying a signal transformation function;
applying a programming voltage to the second line, and
feeding the memory units comprised in the second row by the programming signal as the input signal of each of the memory units.

Advantageously, the memory programming circuit according to the embodiments of the invention enables performing the programming operations of memory devices in the analog domain, in a single parallelized step, thus enabling reducing the energy consumption requirements of practical in-machine computing algorithms.

Advantageously, the memory programming circuit according to the embodiments of the invention enables performing RRAM-based Markov chain sampling in a single step in parallel, without any analog-to-digital or digital-to-analog conversions and by avoiding intermediate memory read/write operations.

Further advantages of the present invention will become clear to the skilled person upon examination of the drawings and the detailed description.

BRIEF DESCRIPTION OF THE DRAWINGS

The accompanying drawings, which are incorporated in and constitute a part of this specification, illustrate various embodiments of the invention together with the general description of the invention given above, and the detailed description of the embodiments given below.

DETAILED DESCRIPTION

Figure 1:
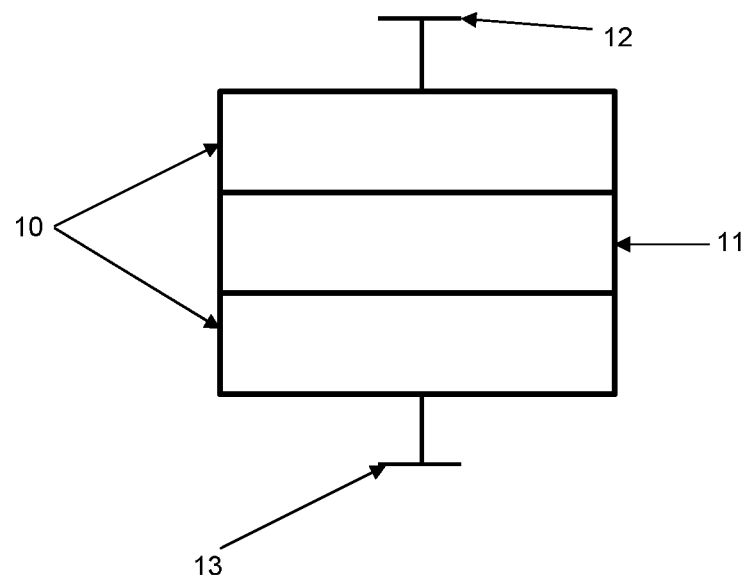
FIG. 1 illustrates an exemplary metal-insulator-metal structure of an RRAM device.
Figure 2:
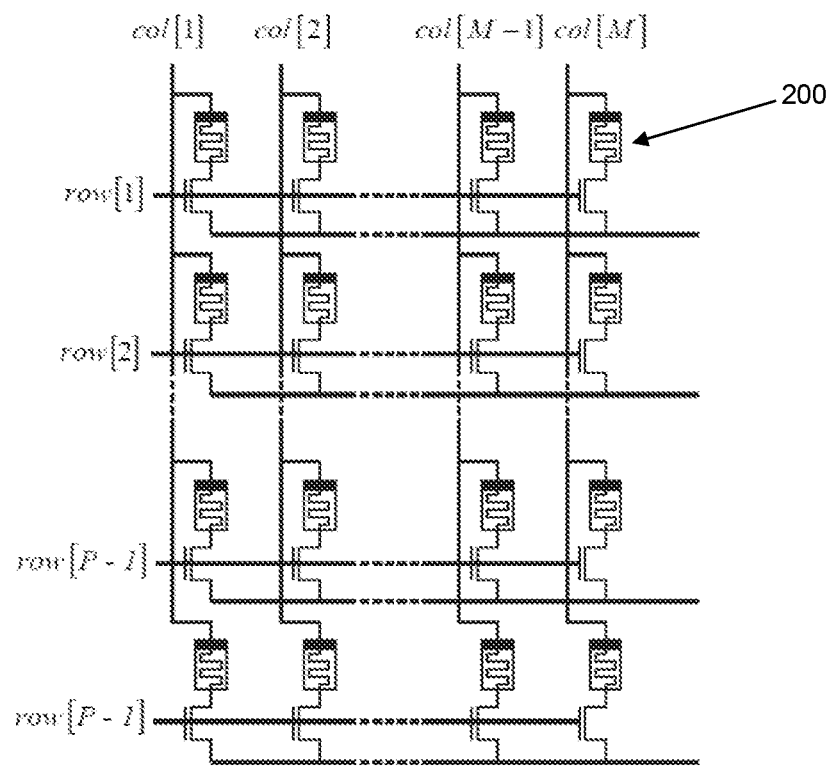
FIG. 2 illustrates an array circuit architecture of an RRAM device, according to state of the art architectures of non-volatile memory devices.

Embodiments of the present invention provide a memory programming circuit for programming a non-volatile memory device, the non-volatile memory device having an array structure comprising a plurality of rows of a given number denoted by P, each row having a row index p varying from 1 to the given number P, that is p=1, ..., P. Each row (of index p varying from 1 to P) among the plurality of rows comprises one or more memory units such that each memory unit receives one or more input signals and delivers one or more output signals.

The embodiments of the invention may be applied for programming non-volatile memory devices used in various cryptographic devices and systems for ultra-small and low-power security and computing primitives. Such cryptographic devices may be used in many fields of applications to ensure security, authentication, protection and privacy of data during their storage and/or transmission, and in various systems such as communication systems data processing systems.

The embodiments of the invention may be used for example for the generation of random bit-streams based on the stochastic physical mechanisms of the non-volatile memory device under programming.

The embodiments of the invention may be used for example in the simulation of random walks based on a Markov chain using the stochastic physical mechanisms of the non-volatile memory device under programming.

The embodiments of the invention may be used for example in the implementation of a Markov chain Monte Carlo sampling algorithm in in-situ machine learning applications on energy constrained systems.

Accordingly, the embodiments of the invention may be used in secured cryptographic devices for the generation of secured data from original data, thus providing a protection of original data against hardware and/or cyber attacks by a hacker or an attacker aiming at acceding to the original data.

The embodiments of the invention may accordingly be applied for programming non-volatile memory devices implemented in secured cryptographic devices that implement hardware and/or software cryptographic mechanisms for ensuring data and/or signals security, authentication, protection, and/or privacy. Such secured cryptographic devices may be implemented in a wide variety of devices such as industrial, information, and consumer devices. Exemplary applications in which the embodiments of the invention may be used for securing data and/or signals comprise:

digital electronics (e.g. ID Card, NFC Sim Cards);
communications for ensuring a secure transfer of data over unsecure transmission channels;
computing networks/systems for securing data center interconnections;
cloud computing applications and cloud servers;
communication applications (e.g. communications over wire-tap channels);
the car industry to ensure anti-theft protection;
service provider systems to provide restricted access;
mobile phone devices to authenticate the control and access to batteries and accessories;
banking industry to secure banking accounts and financial transactions;
medicine to secure medical data and medical devices such as implantable medical devices which can be implanted within the body to treat a medical condition or to monitor the state of the functioning of some body parts (e.g. pacemakers, defibrillators to monitor and treat cardiac conditions, brain monitoring or stimulation devices such as neuro-stimulators for deep brain stimulation in cases such as epilepsy or Parkinson, drug delivery systems, biosensors);
sensitive applications in FPGA, hardware security modules, and electronic components embedded in smartcards or electrical vehicles (Evs);
applications in industry and transportation such as industrial automation, smart meters, automotive, enterprise storage;
storage in smart phones and tablets and mass storage memories;
random number-based security applications including Physically Unclonable Functions (PUF), secret key generation and cryptography;
in-memory computing applications such as Markov chain sampling algorithms implemented in Markov Chain Monte Carlo accelerator chips for example; edge/on-chip learning applications that require ultra-low energy usage comprising for example implanted medical applications.
reinforcement learning based autonomous systems;
stochastic and brain-inspired computing;
etc.

Exemplary cryptographic devices in which the embodiments of the invention may be implemented for providing data and/or signals security comprise, without limitations:

smartcards, tokens to store keys such as wallets, smartcards readers such as Automated Teller Machines (ATM) used for example in financial transactions, restricted access, telecommunications, military applications, secure communication equipments, and TV set-top boxes;
electrical and digital electronic devices such as RFID tags and electronic keys; embedded secure elements;
computers (e.g. desktop computers and laptops), tablets; routers, switches, printers;
mobile phones such as smartphones, base stations, relay stations, satellites; Internet of Things (IoT) devices, robots, drones; and
recorders, multimedia players, mobile storage devices (e.g. memory cards and hard discs) with logon access monitored by cryptographic mechanisms.

Figure 3:
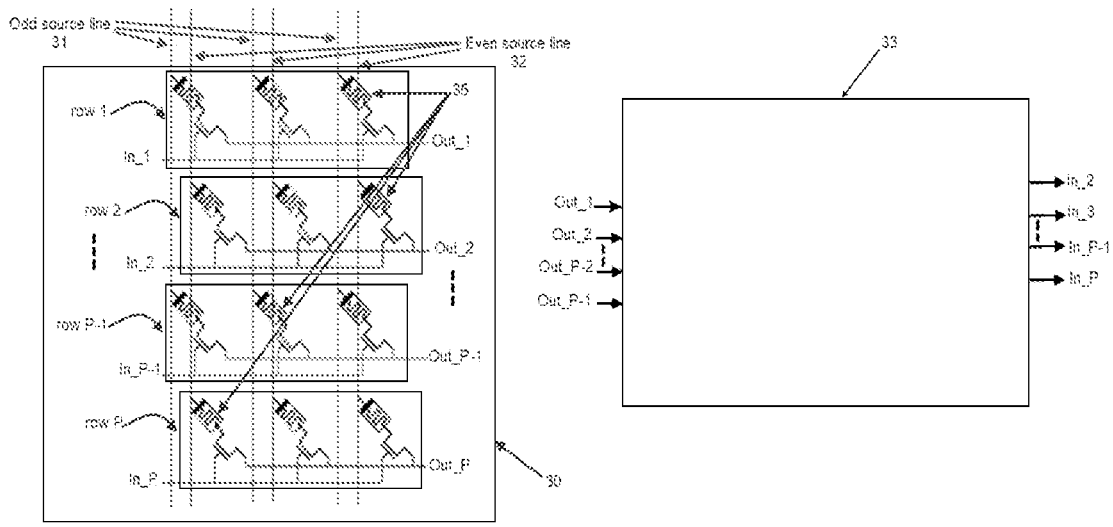
FIG. 3 illustrates a memory programming circuit for programming a non-volatile memory device, according to the embodiments of the invention.

Referring to FIG. 3, the embodiments of the invention provide a memory programming circuit for programming a non-volatile memory device 30. The non-volatile memory device 30 has an array structure comprising a plurality of rows of a given number denoted by P (P being at least equal to two).

Each row among the plurality of P rows has a row index denoted by p and varying from 1 to the given number P. More specifically, the row indices of the plurality of rows comprise even row indices and odd row indices. The odd row indices are denoted by x with x varying in the set of indices $\{1,3,\ldots,X\}$ and the even row indices are denoted by y and thus varying in the set of indices $\{2,4,\ldots,Y\}$, with X being an odd number and Y being an even number such that:

if the given number P is an even number, then X=2.(P div 2) and Y=P−1, with 'div' designating the division operator;
if the given number P is an odd number, then X=P and Y=P−1.

Each row of index p comprises one or more memory units 35. Each memory unit 35 is configured to receive one or more input signals and to deliver one or more output signals. More specifically, a memory unit 35 located at the $p^{th}$ row the array structure having a row index p is configured to receive one or more input signals denoted by In_p and to deliver one or more output signals denoted by Out_p. An output signal delivered by each memory unit 35 represents an internal state of the memory unit 35 that may be modified by programming signals.

Referring to FIG. 3, the memory programming circuit comprises:
- a first source line 31 connected to the top electrodes of the memory units 35 comprised at the rows of odd row indices x with x varying in the set $\{1,3, \ldots, X\}$, and;
- a second source line 32 connected to the top electrodes of the memory units 35 comprised at the rows of even row indices y varying in the set $\{2,4, \ldots, Y\}$.

According to some embodiments, the memory programming circuit may further comprise an analog circuit 33 configured to receive the output signals Out_1, Out_2, ..., Out_(P−1) from the one or more memory units 35 comprised in the plurality of rows of the array structure and to deliver to at least one memory unit 35 of a row index k a programming signal as an input signal In_k for memory units 35 comprised at the kth row of the array structure. According to the embodiments of the invention, the analog circuit 33 is configured to perform a programming operation for each pair of successive rows in the plurality of rows of the array structure, a pair of successive rows comprising a first row of a row index denoted by n and a second row of a row index denoted by n+1, the first row being connected to a first line selected among the first source line 31 and the second source line 32 depending on whether the row index n of the first row is odd or even, the second row being connected to a second line selected among the first source line 31 and the second source line 32 depending on whether the row index n+1 of the second row is odd or even, the analog circuit 33 being configured to perform the programming operation by: reading the output signals Out_n delivered by the memory units 35 comprised in the first row;
- applying a read voltage to the first line;
- determining a programming signal by applying a signal transformation function to the read output signals delivered by the memory units 35 comprised in the first row;
- applying a programming voltage to the second line, and
- feeding the memory units 35 comprised in the second row by the determined programming signal as the input signal In_(n+1) of each of the memory units 35 comprised in the second row.

Accordingly, the memory programming circuit is based on contacting the two source lines to alternating rows such that the rows having even row indices are contacted to the first source line 31 and the rows having odd row indices are contacted to the second source line 32. The first source line 31, also designated as the 'odd' source line, contacts the top electrode of the memory units 35 comprised in the rows having odd row indices x varying in the set $\{1,3, \ldots, X\}$ and the second source line 32, also designated as the 'even' source line, contacts the top electrodes of the memory units 35 comprised in the rows having even row indices y varying in the set $\{2,4, \ldots, Y\}$.

The analog circuit 33 is configured to perform the programming operation in a cascade way by starting at the first pair of successive rows in which the first row is the row of odd row index n=1 and the second row is the row of even row index n+1=2. Accordingly, the first line connected to the first row is the first source line 31, the row index of the first row during this programming operation being odd (n=1). The second line connected to the second row is the second source line 32, the row index of the second row during this programming operation being even (n+1=2). From the random initial state in the first row of row index n=1, the memory units 35 located at this first row are read by the analog circuit 33 and the resulting read signals delivered from these memory units 35 in the forms of the output signals Out_1 are used by the analog circuit 33 to program the memory units 35 comprised in the second row of row index n+1=2. The analog circuit 33 applies a read voltage to the first line which is the first source line 31 for this programming operation, i.e. for n=1 and n+1=2. The analog circuit 33 then determines a programming signal by applying a signal transformation function to the output signals Out_1 read from the memory units 35 comprised in the first row of a row index n=1 and uses the determined programming signal to program the memory units 35 comprised in the second row of a row index n+1=2, these memory units 35 being configured to receive the programming signal as their input signals In_2. The analog circuit 33 applies a programming voltage to the second line which is the second source line 32 for this programming step. Accordingly, during the first programming operation, the first source line 31 is read by the application of a read voltage to the first line and the second source line 32 is programmed by the application of a programming voltage to the second line.

Once the programming of the memory units 35 comprised in the row of row index n+1=2 has finished, the row index n is updated to n=2 (then n+1=3) and the analog circuit 33 performs the memory programming operation for the successive pair of rows comprising as a first row the row of a row index n=2 and as a second row the row of row index n+1=3. The analog circuit 33 uses the memory units 35 located at the row of the first row index n=2 to program the memory units 35 comprised in the second row of row index n+1=3. In this programming operation, the first line connected to the first row and selected among the first source line 31 and the second source line 32 is the second source line 32, the row index of the first row during this programming operation being even (n=2). The second line connected to the second row and selected among the first source line 31 and the second source line 32 is the first source line 31, the row index of the second row during this programming operation being odd (n+1=3). The analog circuit 33 reads the output signals Out_2 delivered by the memory units 35 comprised in the first row of row index n=2, applies a read voltage to the first line, determines a programming signal by applying a signal transformation function to the output signals Out_2, applies a programming voltage to the second line, and feeds the memory units 35 comprised in the second row of a row index n+1=3 by the determined programming signal, the programming signal being thus the input signal In_3 of the memory units 35 comprised in the rows of row index n+1=3. Accordingly, during the second programming operation, the second source line 32 is read by the application of a read voltage to the first line and the first source line 31 is programmed by the application of a programming voltage to the second line.

Using such a cascading programming operation, the analog circuit 33 uses the output signals delivered by the memory units 35 comprised at a given row to program the memory units 35 comprised at the next row in the array structure of the memory device 30 by alternating odd and even rows from the top to the bottom of the array structure in sequence. The cascading programming operation continues until the algorithm arrives to the bottom row of the array structure having performed a random walk due to the implementation of a Markov chain. The cascading programming architecture allows accordingly the simultaneous read of one row and programming of the next row by using two source lines. The application of a reading and programming voltage to the first source line 31 and the second source line 32 is similarly performed in an alternate manner depending on whether the index of the row being read or programmed is even or odd.

In another embodiment in which the array circuit is used to implement a Markov chain Monte Carlo sampling algorithm, an additional counter circuit must be incorporated. MCMC sampling is based on the acceptance or rejection of proposed models between rows n and n+1. Therefore, whenever a model is deemed to be rejected (according to an MCMC sampling algorithm such as Metropolis-Hastings for example) the row counter of row n is incremented by one and the same row n re-programs the same row n+1 again (i.e., n and n+1 still point to the same rows as before the rejection). Only when a model is accepted are n and n+1 updated to the next pair of rows. Tracking rejections in this manner allows the probability density of each model stored at each row (in a Bayesian neuron for example) to be accounted for.

Figure 4:
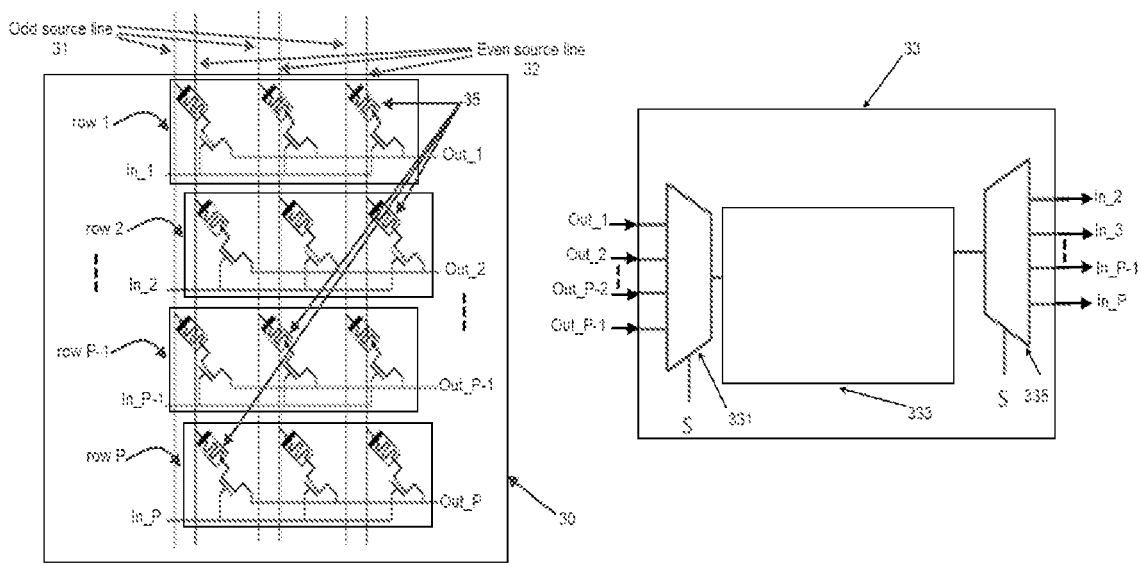
FIG. 4 illustrates a memory programming circuit, according to some embodiments of the invention in which the analog circuit is multiplexed between the rows of the array structure of the non-volatile memory device.

FIG. 4 illustrates an exemplary implementation of the analog circuit 33, according to some embodiments of the invention. More specifically, FIG. 4 illustrates an implementation of the analog circuit 33 as a single circuit multiplexed/de-multiplexed between the plurality of rows in the array structure of the memory device 30. Accordingly, the analog circuit 33 may comprise a multiplexer 331, a signal transformation unit 333, and a de-multiplexer. The multiplexer 331 is configured to receive the output signals Out_1, Out_2, ..., Out_P−1 delivered by the one or more memory units 35 comprised in the plurality of P rows. The signal transforming unit 333 is configured to perform the programming operation. The de-multiplexer 335 is configured to feed each programming signal to the memory units 35 comprised in the appropriate row. Since only a pair of successive rows is considered at a given programming operation, a single read/write circuit can be multiplexed between a plurality of rows. In such embodiments, the analog circuit 33 may comprise a register (not illustrated in the figures) that counts the index of the first row comprised in the pair of successive rows considered during a given programming operation, the index of the first row can be used as a select signal S that determines which signals are multiplexed in the multiplexer 331 and de-multiplexed by the de-multiplexer 335 in the analog circuit 33. The select signal S accordingly enables determining which output signal Out_n feeds into the analog circuit 33 circuit and which appropriate row of the array structure receives the programming signal In_n+1 as the programming voltage to its gate during a given programming operation considering a pair of successive rows of comprising a first row of a row index n and a second row of a row index n+1.

According to some embodiments, the output signals read by the analog circuit 33 may be current signals and the input signals applied by the analog circuit 33 onto the gates of the memory units 35 of the second row of each pair of successive rows may be voltage signals, the programming signal determined by the analog circuit 33 being a voltage signal.

According to some embodiments, the memory device 30 may be an RRAM device in which each memory unit 35 comprises a resistor made of dielectric which can be programmed in a low resistance state (LRS) with a SET programming operation or in a high resistance state (HRS) with a RESET programming operation.

During a SET programming operation, a strong electric field may be applied to the memory units 35, while limiting the current to a programming current value. The SET programming operation forms a conductive filament through the dielectric and brings the resistor to a low resistance (otherwise referred to as a high conductance) value, which depends upon the programming current value.

During a RESET programming operation, a programming voltage may be applied to the memory units 35 with the same or opposite polarity than the one used for electroforming. The programming voltage breaks the filament and the resistor returns therefore to a high resistance (or low conductance) value, which depends upon the programming voltage value.

According to some embodiments of the invention in which the memory programming circuit is used for programming RRAM memory devices, the analog circuit 33 may be configured to perform the programming operation during a SET programming operation or during a RESET programming operation.

According to some embodiments, the signal transformation function may be a current multiplication function. In such embodiments, the analog circuit 33 may be a current buffer amplifier configured to apply a virtual ground, read the current signal delivered by each row comprised in each pair of successive rows during the programming operation, and determine the programming signal as a voltage signal.

Figure 5A:
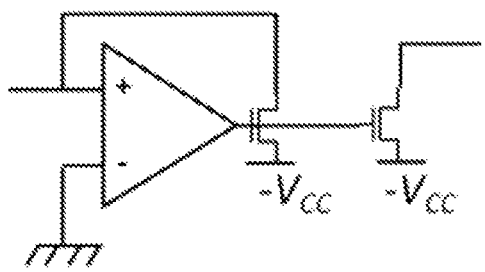
FIG. 5A illustrates a structure of an analog circuit, according to some embodiments of the invention in which a current multiplication function is applied by the analog circuit.
Figure 5B:
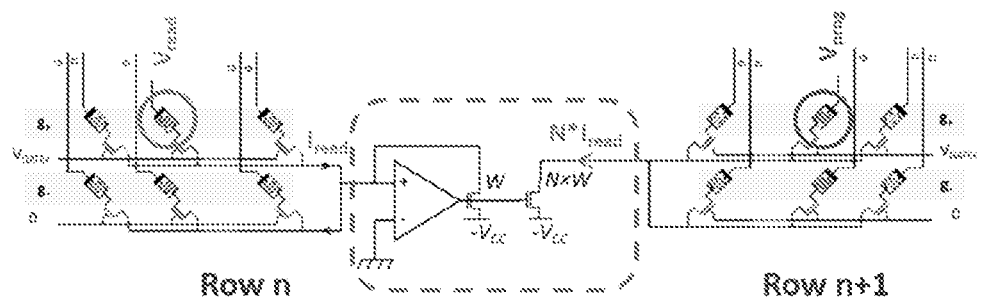
FIG. 5B illustrates the programming operation of a pair of rows according to some embodiments in which a current multiplication function is applied by the analog circuit.

FIG. 5A illustrates the structure of the analog circuit 33 in which the signal transformation function applied by the analog circuit 33 is a current multiplication function, used for example during the programming of RRAM devices. FIG. 5B illustrates the programming operation of a pair of rows according to some embodiments in which a current multiplication function is applied by the analog circuit and in which the row n being read and the row n+1 being programmed comprise each two sub-rows, each sub-row comprising one or more memory units. According, to FIG. 5A and FIG. 5B, the analog circuit 33 may comprise the electronic components configured to operate as current buffers, current amplifiers, and current mirrors to perform the current multiplication function during a SET or a RESET programming operations. The conductance achieved through a SET programming operation depends on the current that flows through the memory device 30 while a positive voltage is applied over the memory device 30. The low conductance state could be used, where the conductance is determined by the negative voltage applied over the memory device 30 during the RESET operation. Based on reading the current of the memory units 35 located at a row of a row index n, the analog circuit 33 determines the programming signal by applying a current multiplication function to the read current denoted by $i_{read}$, the programming signal being in this embodiments a voltage denoted by $V_{prog}$. Referring to FIGS. 5A and 5B, the analog circuit may comprise a resistor-divider configured to turn the read current into a voltage and a buffer and an amplifier configured to buffer and amplify the determined voltage and feed it into the gate of the transistors of the memory units comprised in the row of a row index n+1. The analog circuit 33 applies a voltage to the gate of the programmed memory units comprised in the row of a row index n+1 that causes a current to flow in it, the current flowing being a multiplied version of the read current (the multiplication may be achieved using a current mirror with a certain ratio of transistors widths).

If the resulting output voltage is input to the gate of another transistor, the read current may be copied into the memory units 35 comprised in the row of a row index n+1 if it has the same gate width and length. The read current may also be multiplied by a factor of W2/W1 if the programmed memory units 35 have gates with a gate width W1 and the receiving transistor has a gate width W2. This might be required in RRAM-based MCMC sampling for example in order to multiply up the read current into the appropriate range of SET programming currents.

A current multiplication function may also be used when the memory device 30 under programming is a PCRAM (Phase Change Random Access Memory), an MRAM (Magnetic Random Access Memory), a CBRAM (Conductive Bridging Random Access Memory) or a FeRAM. In a similar way, the analog circuit 33 may be configured to read the current, buffer it and then (possibly) determine a scaled version that is injected into the memory units 35 under programming to determine the conductance.

Figure 6:
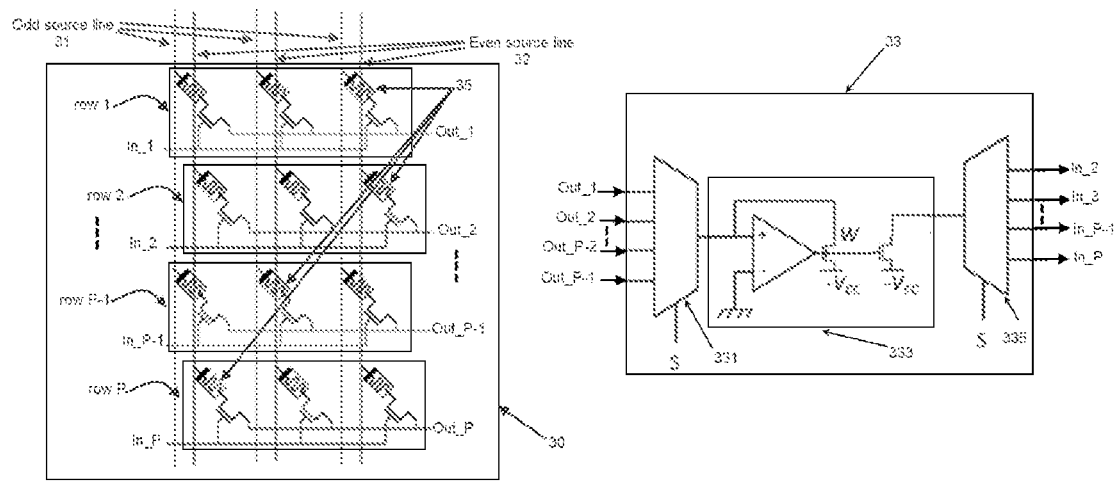
FIG. 6 illustrates a memory programming circuit, according to some embodiments of the invention in which a current multiplication function is applied by the analog circuit.

FIG. 6 illustrates a memory programming circuit, according to some embodiments in which the signal transformation function is a current multiplication function, the signal transformation unit 333 implemented in the analog circuit 33 being configured to implement the components illustrated in FIGS. 5A and 5B and required to perform the current buffering and amplification operations.

Figure 7:
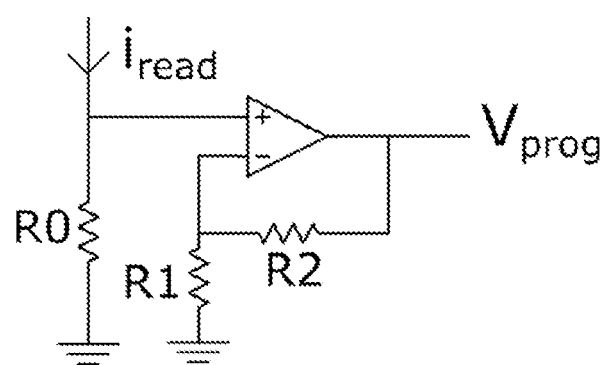
FIG. 7 illustrates a structure of an analog circuit, according to some embodiments in which a voltage multiplication function is applied by the analog circuit.

According to some embodiments in which the memory device 30 under programming is a FLASH transistor, the signal transformation function may be a voltage multiplication. Accordingly, the memory programming circuit may comprise a voltage buffer and multiplication circuit for performing the voltage multiplication function. FIG. 7 illustrates an exemplary structure of the analog circuit 33 configured to perform voltage multiplication in such embodiments.

Figure 8:
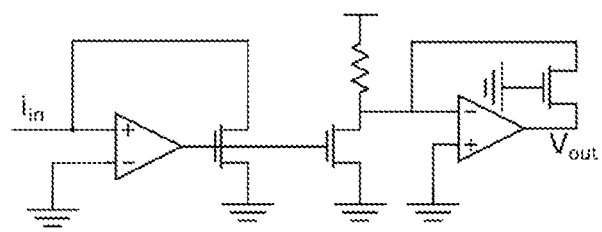
FIG. 8 illustrates a structure of an analog circuit, according to some embodiments of the invention in which a square root function is applied by the analog circuit that might be desired to compensate for the power law that relates SET programming current to programmed conductance state in RRAM and render the transfer function more linear.

According to some embodiments, the signal transformation operation may be a square root function. FIG. 8 illustrates a structure of the analog circuit 33 according to some embodiments of the invention in which a square root function is applied by the analog circuit 33. In such embodiments, the analog circuit 33 is configured to apply a square root function to the read current in order to linearize the current that will thereafter be injected into the memory units that are being programmed. This is because the relationship between programming current and resulting conductance follows a power law in technologies such as RRAM and CBRAM. Applying a square root function enables making the relation between the read current and the injected current more linear over a wider range of currents. In such embodiments, the analog circuit 33 may comprise a square root amplifier of an exponential transfer curve of a sub-threshold biased transistor to perform such square root function. Various modifications could be made on the same set of circuit design principles by a person skilled to implement related functions in voltage or current as required.

Other arbitrary signal transformation functions may be applied on the current if desired using intermediate circuits that take as input the output signals delivered by the memory units 35 comprised a the first row of each pair of successive rows during a given programming operation.

According to some embodiments, the non-volatile memory device 30 may be chosen in a group of non-volatile memory devices comprising phase change memory devices, ferroelectric random access memory devices, and resistive memory devices, said resistive memory devices comprising magneto-resistive random access memory devices, resistive switching random access memory devices, ferromagnetic field effect transistors and FLASH transistors.

The embodiments of the invention provide also a method for programming a non-volatile memory device, the non-volatile memory device having an array structure comprising a plurality of rows of a given number P at least equal to two ('2'), each row having a row index p varying from one to the given number (p=1, . . . , P) and comprising one or more memory units, each memory unit located at a row of a row index p receiving one or more input signals denoted In_p and delivering one or more output signals denoted by Out_p, the method comprising:

connecting a first source line to the top electrode of the memory units comprised at rows of odd row indices, and connecting a second source line to the top electrodes of the memory units comprised at rows of even row indices.

According to some embodiments, the method may further comprise performing a programming operation by an analog circuit for each pair of successive rows in the plurality of rows, a pair of successive rows comprising a first row and a second row, the first row being connected to a first line selected among the first source line and the second source line depending on whether the row index of the first row is odd or even, the second row being connected to a second line selected among the first source line and second source line depending on whether the row index of the second row if odd or even, the programming operation comprising:

reading the output signals delivered by the memory units comprised in the first row; applying a read voltage to the first line;

determining a programming signal from the output signals by applying a signal transformation function;

applying a programming voltage to the second line, and feeding the memory units comprised in the second row by said programming signal as the input signal of each of said memory units.

The invention claimed is:

1. A non-volatile memory device comprising a memory programming circuit for programming said non-volatile memory device, said non-volatile memory device having an array structure comprising a plurality of rows of a given number, each row having a row index varying from one to said given number and comprising one or more memory units, each memory unit being configured to receive one or more input signals and to deliver one or more output signals, wherein the memory programming circuit comprises:

a plurality of first source lines connected to the top electrode of the memory units comprised at rows of odd row indices, and;

a plurality of second source lines connected to the top electrodes of the memory units comprised at rows of even row indices;

an analog circuit configured to receive the output signals delivered by said one or more memory units and to deliver to at least one memory unit a programming signal as an input signal, said analog circuit being configured to perform a programming operation for each pair of successive rows in said plurality of rows, a pair of successive rows comprising a first row and a second row, the first row being connected to a first line selected among said plurality of first source lines and said plurality of second source lines depending on whether the row index of said first row is odd or even, the second row being connected to a second line selected among said plurality of first source lines and said plurality of second source lines depending on whether the row index of said second row is odd or even, the analog circuit being configured to perform said programming operation by:

reading the output signal or signals delivered by the memory units comprised in said first row;

applying a read voltage to said first line;

determining a programming signal by applying a signal transformation function to said output signals;

applying a programming voltage to said second line, and feeding the memory units comprised in said second row by said programming signal as the input signal of each of said memory units.

2. The non-volatile memory device of claim 1, wherein said analog circuit is a single circuit multiplexed between said plurality of rows, said analog circuit comprising a multiplexer, a signal transforming unit, and a de-multiplexer, said multiplexer being configured to receive the output signals delivered by the one or more memory units comprised in said plurality of rows, said signal transforming unit being configured to perform said programming operation, and said de-multiplexer being configured to feed each programming signal to the memory units comprised in the appropriate row.

3. The non-volatile memory device of claim 1, wherein the signal transformation function is a current multiplication function, said output signal being a current signal, the analog circuit being a current buffer amplifier configured to apply a virtual ground, read said current signal and determine said programming signal as a voltage signal.

4. The non-volatile memory device of claim 3, wherein said analog circuit comprising a resistor-divider configured to determine said voltage signal from the read current.

5. The non-volatile memory device of claim 1, wherein the signal transformation function is a square root function.

6. The non-volatile memory device of claim 1, wherein the signal transformation function is a voltage multiplication function.

7. The non-volatile memory device of claim 1, wherein said non-volatile memory device is chosen in a group of non-volatile memory devices comprising phase change memory devices, ferroelectric random access memory devices, ferromagnetic field effect transistors, FLASH transistors, and resistive memory devices, said resistive memory devices comprising magneto-resistive random access memory devices and resistive switching random access memory devices.

8. A method for programming a non-volatile memory device, said non-volatile memory device having an array structure comprising a plurality of rows of a given number, each row having a row index varying from one to said given number and comprising one or more memory units, each memory unit receiving one or more input signals and delivering one or more output signals, wherein the method comprises:

connecting a plurality of first source lines to the top electrode of the memory units comprised at rows of odd row indices, and connecting a plurality of second source lines to the top electrodes of the memory units comprised at rows of even row indices;

performing a programming operation by an analog circuit for each pair of successive rows in said plurality of rows, a pair of successive rows comprising a first row and a second row, the first row being connected to a first line selected among said first source line and said second source line depending on whether the row index of said first row is odd or even, the second row being connected to a second line selected among said first source line and second source line depending on whether the row index of said second row if odd or even, said programming operation comprising:

reading the output signals delivered by the memory units comprised in said first row;

applying a read voltage to the first line;

determining a programming signal from said output signals by applying a signal transformation function;

applying a programming voltage to said second line, and feeding the memory units comprised in said second row by said programming signal as the input.

* * * * *